United States Patent
Fu et al.

(10) Patent No.: US 9,170,496 B2
(45) Date of Patent: Oct. 27, 2015

(54) METHOD OF PRE-TREATING A WAFER SURFACE BEFORE APPLYING A SOLVENT-CONTAINING MATERIAL THEREON

(75) Inventors: Chi-Hua Fu, Hsinchu County (TW); Chung-Cheng Wang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 772 days.

(21) Appl. No.: 13/365,660

(22) Filed: Feb. 3, 2012

(65) Prior Publication Data
US 2013/0137034 A1 May 30, 2013

Related U.S. Application Data
(60) Provisional application No. 61/565,145, filed on Nov. 30, 2011.

(51) Int. Cl.
| | |
|---|---|
| *B08B 3/02* | (2006.01) |
| *B08B 3/00* | (2006.01) |
| *B08B 7/00* | (2006.01) |
| *B08B 7/04* | (2006.01) |
| *G03F 7/16* | (2006.01) |
| *G03F 7/09* | (2006.01) |
| *G03F 7/095* | (2006.01) |

(52) U.S. Cl.
CPC ... *G03F 7/16* (2013.01); *B08B 3/00* (2013.01); *B08B 3/02* (2013.01); *B08B 7/00* (2013.01); *B08B 7/04* (2013.01); *G03F 7/091* (2013.01); *G03F 7/094* (2013.01); *G03F 7/095* (2013.01)

(58) Field of Classification Search
CPC .............. B08B 3/00; B08B 3/02; B08B 7/00; B08B 7/04
USPC ........... 134/32, 33, 34, 26, 27, 28, 29; 216/91
See application file for complete search history.

(56) References Cited

U.S. PATENT DOCUMENTS

| | | | | |
|---|---|---|---|---|
| 6,033,728 | A * | 3/2000 | Kikuchi et al. | 427/240 |
| 6,238,511 | B1 * | 5/2001 | Sada et al. | 156/704 |
| 2003/0108823 | A1 * | 6/2003 | Muraoka et al. | 430/329 |
| 2008/0053489 | A1 * | 3/2008 | Mizota et al. | 134/33 |

* cited by examiner

*Primary Examiner* — Saeed T Chaudhry
(74) *Attorney, Agent, or Firm* — Hauptman Ham, LLP

(57) ABSTRACT

A method for pre-treating a wafer surface before applying a material thereon. The method includes positioning the wafer on a rotating apparatus. The wafer is rotated at a first rotational speed between about 50 revolutions per minute (rpm) and about 300 rpm and for a period of about 1 second to about 10 seconds while dispensing a cleaning solvent on the wafer surface. The wafer is rotated at a second rotational speed between about 500 rpm and about 1,500 rpm for a period of about 1 second to about 10 seconds. The wafer is then rotated at a third rotational speed between about 50 rpm and about 300 rpm for a period of about 1 second to about 5 seconds. With the wafer rotating at the third rotational speed, a solvent-containing material is thereafter deposited on the surface of the wafer.

20 Claims, 2 Drawing Sheets

METHOD OF PRE-TREATING A WAFER SURFACE BEFORE APPLYING A SOLVENT-CONTAINING MATERIAL THEREON

CROSS-REFERENCE TO RELATED APPLICATION

The present application claims priority of U.S. Provisional Patent Application No. 61/565,145, filed on Nov. 30, 2011, which is incorporated herein by reference in its entirety.

FIELD

The disclosure relates generally to the fabrication of semiconductor devices, and more particularly, to a method of pre-treating a wafer surface before applying a solvent-containing material thereon.

BACKGROUND

Since the beginning of semiconductor manufacturing, photolithography has been recognized as the driving force behind the integrated circuit fabrication process. This trend continues today as the industry strives to pack more devices and the associated circuitry on a chip. As one of the first steps in a lithography process or between deposition processes, a wafer undergoes a preparation process to clean and prepare the wafer surface for a material layer, such as a tri-layer photoresist layer to be coated onto the semiconductor substrate. Wafer surface preparation is critical to achieve a high-yield photolithography process, since many types of defects can be traced back to improperly prepared or contaminated wafers.

A wafer surface is typically prepared by applying a cleaning solvent onto the wafer surface. The manner of dispensing the cleaning solvent varies depending on the application desired. The solvent can be dispensed on the wafer while the wafer is not rotating, known by a process as "static reducing resist consumption (RRC) dispense." After the static RRC dispense, the wafer is first spun at a low revolutions per minute (rpm) to uniformly spread the solvent. Once the solvent reaches the wafer edge, the rpm are accelerated to a final spin speed. Another approach is to dispense the cleaning solvent on the wafer that is spinning slowly in order to uniformly coat the wafer, followed by acceleration to the final spin speed. This is referred to as a "dynamic RRC dispense."

Once the solvent has been dispensed onto the wafer surface, a photoresist layer can thereafter be spin coated onto the surface. In both the static RRC and the dynamic RRC dispense approaches, however, the photoresist layer applied onto the wafer surface may exhibit poor coverage, poor coating, or pinholes (very small holes) in the resist. Poor coating or uneven resist coating are undesirable because these wafers can exhibit low yields or fatal defects. Pinholes are microscopically small voids that pass completely through the resist to the substrate material. They are undesirable for subsequent etch processing because the etch chemicals can pass through the small voids and damage the underlying substrate material. These problems are more evident in wafers produced at advanced processing nodes, such as 28 nm and beyond where more device features are packed on the chip.

BRIEF DESCRIPTION OF DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
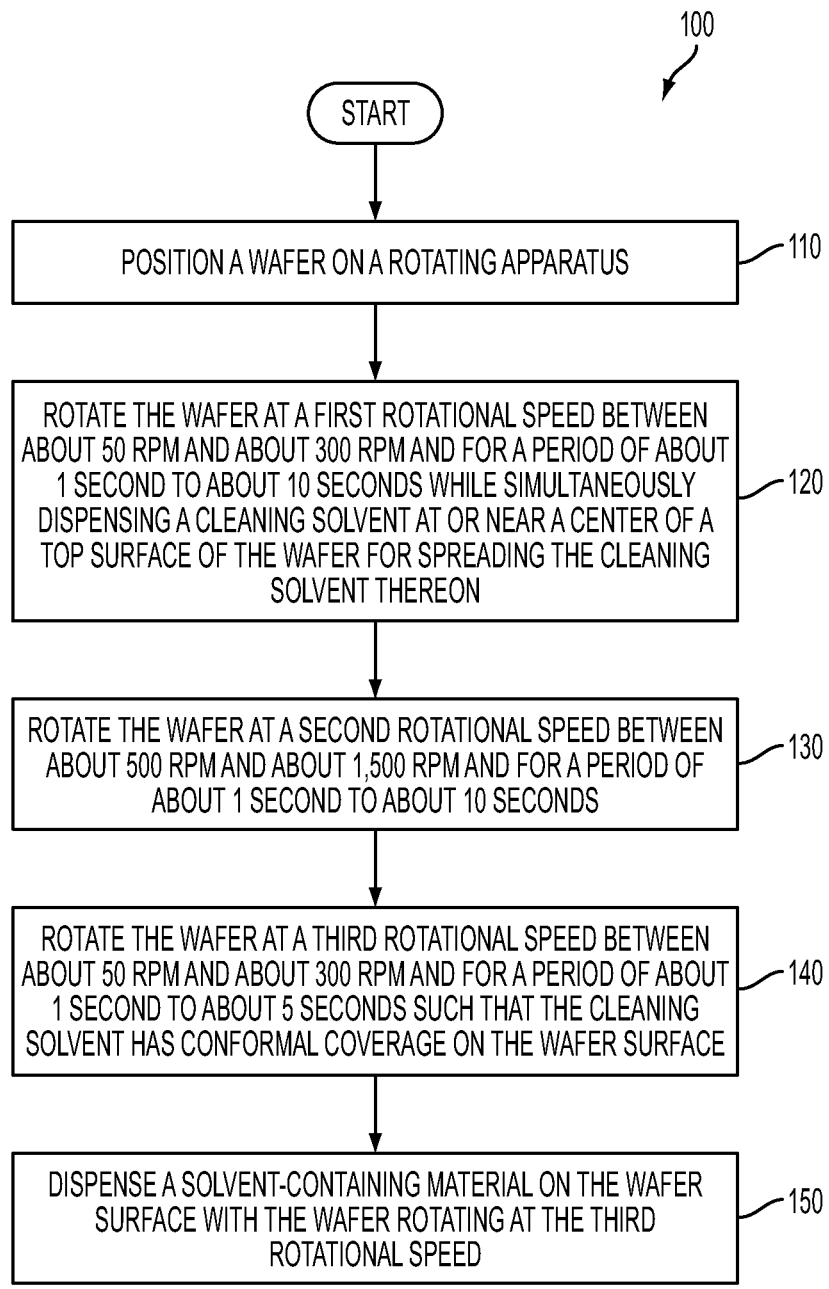
FIG. 1 is a flowchart illustrating a method for pre-treating a wafer surface before applying a solvent-containing material thereon, according to various aspects of the present disclosure.

Illustrated in FIG. 1 is a flowchart of a method 100 for pre-treating a wafer surface before applying a solvent-containing material thereon, according to various aspects of the present disclosure. Referring to FIG. 1, the method includes block 110, in which a wafer is positioned on a rotating apparatus, such as a pedestal or vacuum chuck. The method 100 includes block 120, in which the wafer is rotated at a first rotational speed between about 50 revolutions per minute (rpm) and about 300 rpm and for a period of about 1 second to about 10 seconds while simultaneously dispensing a cleaning solvent at or near a center of a top surface of the wafer for spreading the cleaning solvent thereon. The method 100 includes block 130, in which the wafer is rotated at a second rotational speed between about 500 rpm and about 1,500 rpm and for a period of about 1 second to about 10 seconds. The method 100 includes block 140, in which the wafer is rotated at a third rotational speed between about 50 rpm and about 300 rpm and for a period of about 1 second to about 5 seconds such that the cleaning solvent has conformal coverage on the wafer surface. The method 100 includes block 150, in which a solvent-rich material is dispensed on the surface of the wafer with the wafer rotating at the third rotational speed.

It is understood that additional processes may be performed before, during, or after the blocks 110-150 shown in FIG. 1 to complete the pre-treatment process of the wafer surface, but these additional processes are not discussed herein in detail for the sake of simplicity.

Figure 2A:
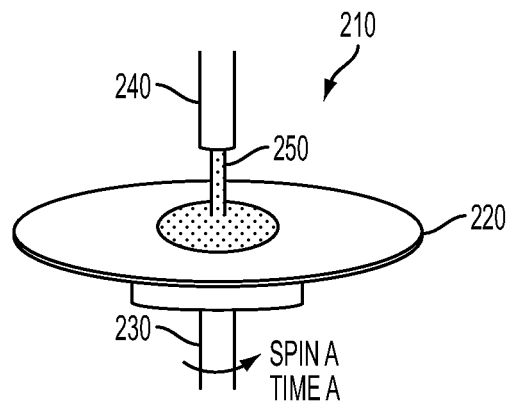
FIGS. 2A-2C are cross-sectional views of a wafer and a spin coating apparatus utilized in carrying out the present invention at various processing steps, in accordance with various aspects of the present disclosure.
Figure 2B:
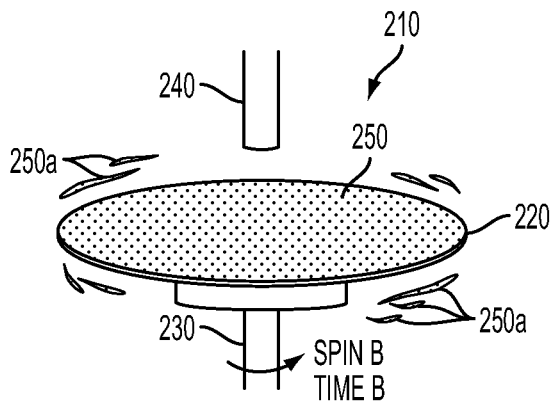
Figure 2C:
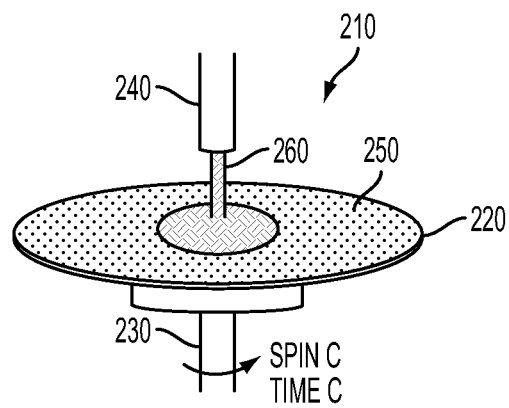

FIGS. 2A-2C are cross-sectional views of a spin coating apparatus utilized in carrying out the present invention, according to embodiments of the method 100 of FIG. 1. It is understood that FIGS. 2A-2C have been simplified for a better understanding of the inventive concepts of the present disclosure.

Referring to FIG. 2A, a spin coating apparatus 210 is provided with a wafer 220 positioned on a rotating apparatus or a wafer pedestal 230. Wafer 220 is rotated or spun by wafer pedestal 230 at a first spin speed, Spin A for a first time period, Time A whilst a cleaning solvent 250 is dispensed at or near a center of a top surface of wafer 220 for spreading the cleaning solvent 250 thereon. The cleaning solvent 250 is injected from a dispenser 240 at a suitable flow rate and at a predetermined amount. In some embodiments, the cleaning solvent 250 is dispensed at a flow rate between about 5 standard cubic centimeters per minute (sccm) and about 30 sccm. A suitable first time period, Time A and first spin speed, Spin A can be chosen for different cleaning solvents and/or for cleaning solvents having different viscosities. In some embodiments, the first spin speed, Spin A is between 50 revolutions per minute (rpm) and about 300 rpm for a period of about 1 second to about 10 seconds.

The cleaning solvents 250 that can be utilized in the present disclosure include OK73 (70% Propylene glycol monomethylether+30% propylene glycol monomethylether acetate), PC73 (70% Propylene glycol monomethylether acetate+30% cyclohexanone), N-thinner (cyclohexanone), or NMP (N-methyl-pyrrolidinone). It should be noted that while OK73, PC73, N-thinner, and NMP solvents are given as examples in the present disclosure, embodiments of the method are not limited to the application of these 4 solvents. Any other chemical solvents may be suitably used. At the first spin speed, Spin A, the cleaning solvent 250 is spun-out or spread out by centrifugal forces toward the edge of wafer 220, thereby substantially completely covering the top surface thereof.

Following application of the cleaning solvent 250 to wafer 220 and the rotation of wafer 220 at the first spin speed, Spin A and first time period, Time A, the rotation of wafer 220 is accelerated to a second spin speed, Spin B for a second time period, Time B, as shown in FIG. 2B. In one embodiment, the second spin speed, Spin B can be between 500 revolutions per minute (rpm) and about 1,500 rpm for a period of about 1 second to about 10 seconds. At the second spin speed, Spin B wafer 220 is accelerated and spun at a faster rate than the first spin speed, Spin A so that the cleaning solvent can be evenly spread out over the entire wafer surface to obtain a substantially uniform thickness and substantially leveled on the top surface of wafer 220. During the second spin speed, Spin B, excess cleaning solvent 250a may be thrown off wafer 220 to obtain the uniform cleaning solvent film coating on the wafer.

Following the rotation of the wafer 220 at the second spin speed, Spin B and second time period, Time B, the rotation of wafer 220 is slowed down to a third spin speed, Spin C for a third time period, Time C, as shown in FIG. 2C. In some embodiments, the third spin speed, Spin C is between 50 revolutions per minute (rpm) and about 300 rpm for a period of about 1 second to about 5 seconds.

At the third spin speed, Spin C and with wafer 220 still rotating, a predetermined amount of solvent-containing material 260 is dispensed on the surface thereof. The solvent-containing material 260 may be a light-sensitive material such as a photoresist material or a tri-layer photoresist having a bottom layer, middle layer, and a top layer. A photoresist layer typically contains between about 60 and about 85% cleaning solvent. In a tri-layer photoresist, the bottom layer typically contains a cleaning solvent, the middle layer contains an anti-reflective coating (ARC) layer, and the top layer contains a photoresist layer. As the name suggests, the solvent-containing material 260 may be any such material that contains solvents therein, such as cleaning solvents.

After the solvent-containing material or photoresist material 260 is dispensed onto wafer 220, in a spin-up step wafer 220 is quickly accelerated to rotate the wafer 220 to a high rpm spin speed to spread the resist over the entire wafer surface. Excess resist may be thrown off to obtain a uniform resist film coating on wafer 220. In the above multi-step spin process, as the cleaning solvent 250 is spread out evenly on the wafer surface and therefore has a substantially uniform thickness, the photoresist material that is deposited on the wafer 220 will also have a substantially uniform thickness and be substantially level on the wafer surface.

One or more embodiments of the method of the present disclosure have several advantages over other methods of pre-treating a wafer surface prior to depositing a solvent-containing material layer, such as a photoresist layer. Having a multi-step varied spin rate approach of slow, fast and then slow spin, the method of the present disclosure allows for a solvent-rich material such as a photoresist layer to achieve a substantially uniform thickness and good coverage of the wafer surface. Moreover, when the resist material has good coverage and good coating pinholes in the resist can be avoided.

Another advantage of one or more embodiments of the method of the present disclosure is better wettability and adhesion between the cleaning solvent and a resist, such as a tri-layer resist, for example as both the cleaning solvent 250 and the bottom layer of the tri-layer resist contain cleaning solvent. With a substantially uniform cleaning solvent film coating on the wafer, the photoresist adheres better to the substrate, thus avoiding problems caused during subsequent etch or ion implantation processing. Moreover, as discussed above both photoresists and tri-layer resists already contain between about 60% and about 85% solvent. As the photoresist or the bottom layer of a tri-layer resist are solvent-rich, less photoresist or tri-layer resist material will be dispensed on the wafer to sufficiently coat the wafer because there is already cleaning solvent on the wafer surface from the multi-step spin rate approach of the present disclosure. This is advantageous because using less resist material reduces waste. It is understood that not all embodiments of the present disclosure have all the advantages discussed. Some embodiments may have some advantages. Some embodiments may have all the advantages.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method for pre-treating a wafer surface, the method comprising:
    positioning a wafer on a rotating apparatus;
    rotating the wafer at a first rotational speed between about 50 revolutions per minute (rpm) and about 300 rpm and for a period of about 1 second to about 10 seconds while simultaneously dispensing a cleaning solvent at or near a center of a top surface of the wafer for spreading the cleaning solvent thereon;

rotating the wafer at a second rotational speed between about 500 rpm and about 1,500 rpm and for a period of about 1 second to about 10 seconds; and rotating the wafer at a third rotational speed between about 50 rpm and about 300 rpm and for a period of about 1 second to about 5 seconds such that the cleaning solvent has conformal coverage on the surface of the wafer.

2. The method of claim 1, wherein the cleaning solvent is dispensed at a flow rate between about 5 standard cubic centimeters per minute (sccm) and about 30 sccm.

3. The method of claim 1, wherein the cleaning solvent is continually dispensed on the surface of the wafer until the wafer is rotated at the second rotational speed.

4. The method of claim 1, wherein the cleaning solvent comprises one of OK73 (70% Propylene glycol monomethylether+30% propylene glycol monomethylether acetate), PC73 (70% Propylene glycol monomethylether acetate+30% cyclohexanone), N-thinner (cyclohexanone), or NMP (N-methyl-pyrrolidinone).

5. The method of claim 1, wherein the rotating the wafer at the first rotational speed comprises spreading out the cleaning solvent to substantially cover an entire top surface of the wafer.

6. The method of claim 1, with the wafer rotating at the third rotational speed, further comprising dispensing a solvent-containing material on the surface of the wafer.

7. The method of claim 6, wherein the solvent-containing material is a light-sensitive material.

8. The method of claim 6, wherein the solvent-containing material is a photoresist material.

9. The method of claim 6, wherein the solvent-containing material is a tri-layer photoresist having a bottom layer, a middle layer, and a top layer.

10. The method of claim 9, wherein the bottom layer comprises a first photoresist layer, the middle layer comprises an anti-reflective coating (ARC) layer, and the top layer comprises a second photoresist layer.

11. A method for delivering a cleaning solvent onto a wafer surface, the method comprising:

positioning a wafer on a pedestal;

rotating the wafer at a first rotational speed between about 50 revolutions per minute (rpm) and about 300 rpm and for a period of about 1 second to about 10 seconds while simultaneously dispensing the cleaning solvent at or near a center of a top surface of the wafer for spreading the cleaning solvent thereon;

increasing the first rotational speed;

rotating the wafer at a second rotational speed between about 500 rpm and about 1,500 rpm and for a period of about 1 second to about 10 seconds;

reducing the second rotational speed; and rotating the wafer at a third rotational speed between about 50 rpm and about 300 rpm and for a period of about 1 second to about 5 seconds such that the cleaning solvent has conformal coverage on the surface of the wafer.

12. The method of claim 11, wherein the cleaning solvent is dispensed at a flow rate between about 5 standard cubic centimeters per minute (sccm) and about 30 sccm.

13. The method of claim 11, wherein the cleaning solvent is continually dispensed on the surface of the wafer until the wafer is rotated at the second rotational speed.

14. The method of claim 11, wherein the cleaning solvent comprises one of OK73 (70% Propylene glycol monomethylether+30% propylene glycol monomethylether acetate), PC73 (70% Propylene glycol monomethylether acetate+30% cyclohexanone), N-thinner (cyclohexanone), or NMP (N-methyl-pyrrolidinone).

15. The method of claim 11, wherein the rotating the wafer at the first rotational speed comprises spreading out the cleaning solvent to substantially cover an entire top surface of the wafer.

16. The method of claim 11, with the wafer rotating at the third rotational speed, further comprising dispensing a solvent-rich material on the surface of the wafer.

17. The method of claim 16, wherein the solvent-rich material is a light-sensitive material.

18. The method of claim 16, wherein the solvent-rich material is a photoresist material.

19. The method of claim 16, wherein the solvent-rich material is a tri-layer photoresist having a bottom layer, a middle layer, and a top layer.

20. The method of claim 19, wherein the bottom layer comprises a first photoresist layer, the middle layer comprises an anti-reflective coating (ARC) layer, and the top layer comprises a second photoresist layer.

* * * * *